(12) United States Patent
Lau et al.

(10) Patent No.: US 6,380,347 B1
(45) Date of Patent: Apr. 30, 2002

(54) NANOPOROUS POLYMERS COMPRISING MACROCYCLES

(75) Inventors: Kreisler Lau, Sunnyvale, CA (US); Tian-An Chen, Duluth, GA (US); Boris Korolev, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/544,504

(22) Filed: Apr. 6, 2000

Related U.S. Application Data

(60) Provisional application No. 60/128,493, filed on Apr. 9, 1999.

(51) Int. Cl.[7] ............................................. C08G 65/38
(52) U.S. Cl. ........................ 528/219; 528/397; 528/401
(58) Field of Search ................................ 528/219, 397, 528/401

(56) References Cited

U.S. PATENT DOCUMENTS

| | | | | |
|---|---|---|---|---|
| 5,264,538 A | * | 11/1993 | Mullins et al. | 528/226 |
| 5,354,841 A | | 10/1994 | Geibel et al. | 528/388 |
| 5,869,599 A | * | 2/1999 | Hay et al. | 528/389 |
| 5,874,516 A | * | 2/1999 | Burgoyne et al. | 528/219 |

OTHER PUBLICATIONS

Chem Abstract: 133:18276 Poly (arylene ether) homopolymers compostions, monomers, and their manufacture for coating wafers Jun. 2000 Lau et al.*

133:65433 Synthesis and investigations of aromatic polyethers bearing acetylenic groups in backbones 1998 Rusanov et al.*

* cited by examiner

*Primary Examiner*—Duc Truong
(74) *Attorney, Agent, or Firm*—Robert D. Fish; Rutan & Tucker, LLP

(57) ABSTRACT

Compositions and methods are provided in which an electrical device is fabricated by incorporating macrocycles in a polymer on a substrate portion of the device, and crosslinking the polymer to form a crosslinked polymer. It is preferred that at least some of the macrocycles are relatively large, including at least six rings in the backbone of a macrocycle. It is also preferred that rings used in forming the macrocycles may be relatively large, preferably having at least six members as in phenyl rings. The intermacrocyclic links can be relatively complex, such as where four macrocycles may be coupled to a single atom or a single phenyl group. In yet other aspects, macrocycles can be heavily conjugated, with more preferred macrocycles having a completely conjugated backbone. In yet other aspects the macrocycles can have backbones with ether, carboxyl, and ethynyl groups, some of which can be used in crosslinking without reliance on an extrinsic crosslinker. In still another aspect, the macrocycles can be fabricated from a bisphenol and a difluoroaromatic compound.

30 Claims, 7 Drawing Sheets

K₂CO₃, NMP
Stage 1: 100-110C, 2hrs
Stage 2: 120C, 6hrs

Ar:

Ar': see Figures 2A-2I

NANOPOROUS POLYMERS COMPRISING MACROCYCLES

This application claims the benefit of U.S. provisional application No. 60/128,493 filed on Apr. 9, 1999, which is incorporated herein by reference in its entirety.

FIELD OF THE INVENTION

The field of the invention is nanoporous materials.

BACKGROUND

As the size of functional elements in integrated circuits decreases, complexity and interconnectivity increases. To accommodate the growing demand of interconnections in modem integrated circuits, on-chip interconnections have been developed. Such interconnections generally consist of multiple layers of metallic conductor lines embedded in a low dielectric constant material. The dielectric constant in such material has a very important influence on the performance of an integrated circuit. Materials having low dielectric constants (i.e., below 2.2) are desirable because they allow faster signal velocity and shorter cycle times. Moreover, lowering of the dielectric constant reduces capacitive effects, leading often to less cross talk between conductor lines and lower voltages to drive integrated circuits.

One way of achieving low dielectric constants is to select materials with inherently low dielectric constants. Generally, two different classes of low dielectric constant materials have been employed in recent years—inorganic oxides and organic polymers. Inorganic oxides often have dielectric constants between 2.5 and 4, which tends to become problematic when device features are smaller than 1 $\mu$m. Organic polymers, including epoxy networks, cyanate ester resins and polyimides vary greatly in their usefulness as low dielectric material. Epoxy networks frequently show disadvantageously high dielectric constants at about 3.8–4.5. Cyanate ester resins have relatively low dielectric constants between approximately 2.5–3.7, but tend to be rather brittle, thereby limiting their utility. Polyimides have shown many advantageous properties including high thermal stability, ease of processing, low stress/TCE, low dielectric constant and high resistance. Polyimides are therefore frequently used as alternative low dielectric constant polymers.

Another way of achieving low dielectric constants is to introduce air into an appropriate material, since air has a dielectric constant of about 1.0. Air is usually introduced into a material by formation of minute voids (also referred to herein as pores), with a size in the sub-micrometer range. Such porous material is then usually termed "nanoporous material". It is known to produce nanoporous polymers by providing a polymer with thermolabile regions, and then thermolyzing the thermolabile regions to produce voids. Examples are set forth in U.S. Pat. No. 5,776,990 to Hedrick et al.

There are, however, technical difficulties in regulating the pore size and distribution. It is also problematic in some applications to provide a material with sufficient heat to thermolize the thermolabile portions. It is therefore desirable to provide nanometer-sized voids by another means, which does not require thermolysis.

SUMMARY OF THE INVENTION

In accordance with the present invention, compositions and methods are provided in which an electrical device is fabricated by depositing macrocycles on a substrate portion of the device, wherein the macrocycles may be part of polymeric strands, which are subsequently crosslinked to form a crosslinked polymer. Where the macrocycles are not part of the polymeric strands, the macrocycles are integrated into the crosslinked polymer by a crosslinking reaction.

In one aspect of the inventive subject matter, at least some of the macrocycles are relatively large, including at least six rings in the backbone of the macrocycles. Especially large macrocycles may have 12 or more rings in the backbone, while the rings themselves may be relatively large, preferably having at least six atoms such as in phenyl rings.

In one class of preferred embodiments, the macrocycles form part of the backbone in the polymer. In another class of preferred embodiments, the macrocycles are grafted onto the polymer, and in a third class of preferred embodiments, the macrocycles are employed in crosslinking strands of the polymer.

In yet another aspect of the inventive subject matter, intermacrocyclic links can be relatively complex. For example, two of the macrocycles may be coupled to a single atom, such as a carbon or a silicon atom. Multiple macrocycles may also be coupled to a single phenyl group. Furthermore, the macrocycles can be heavily conjugated, with more preferred macrocycles having a completely conjugated backbone, and it is preferred that the macrocycles are fabricated from a bisphenol and a difluoroaromatic compound. In still further aspects of preferred embodiments, the macrocycles can have backbones with ether, carboxyl, and ethynyl groups, some of which can be used in crosslinking without reliance on an extrinsic crosslinker.

Various objects, features, aspects and advantages of the present invention will become more apparent from the following detailed description of preferred embodiments of the invention, along with the accompanying drawing.

DETAILED DESCRIPTION

Figure 1:
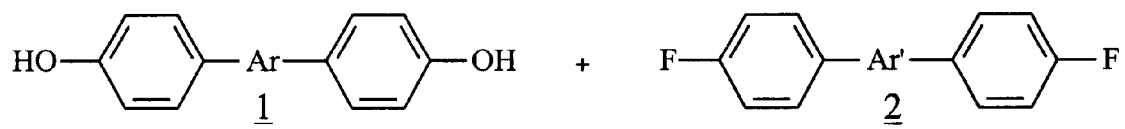
FIG. 1 is a general synthetic scheme for fabricating poly(arylene ethers).
Figure 1:
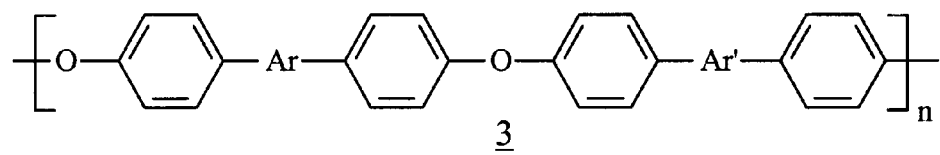
Figure 1:
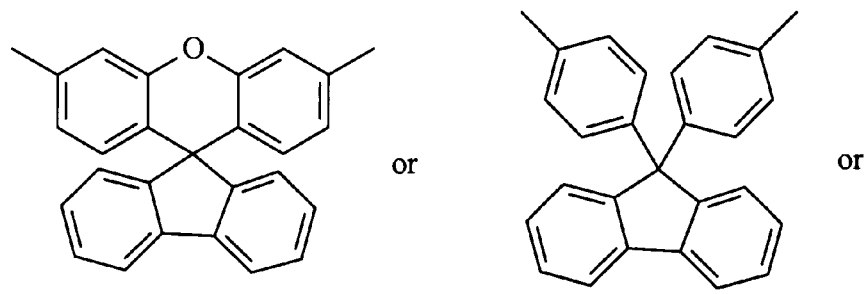
Figure 1:
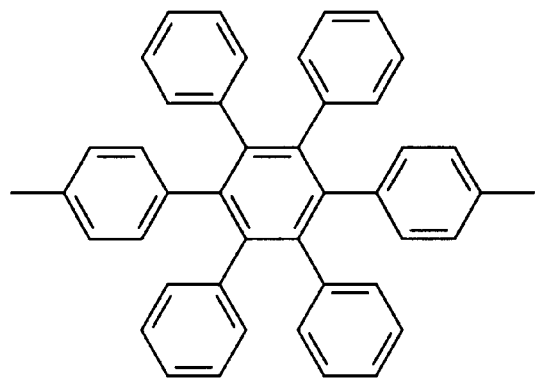

As used herein the term "macrocycle" refers to a chemical structure in which a plurality of rings are covalently coupled to each other, optionally through linkers, such that they form a giant ring-shaped structure (i.e., a ring of rings). Rings employed in forming the macrocycle preferably have between 3 and 16 atoms, more preferably carbon atoms, and even more preferably include phenyl and polycyclic alkanes. The macrocycle may advantageously be constructed from building blocks comprising non-cyclized chains of rings.

In accordance with the teachings herein, an electrical device can be fabricated in a variety of methods employing at least the following steps: providing a plurality of macrocycles; depositing at least some of the macrocycles onto a substrate portion of the electrical device; polymerizing the at least some of the macrocycles on the substrate portion to form a plurality of polymeric strands, crosslinking at least some of the polymeric strands on the substrate portion to form a crosslinked polymer. Alternatively, an electrical device can be fabricated by a method including the following steps: Providing a plurality of polymeric strands having at least one macrocycle; depositing at least some of the polymeric strands onto a substrate portion of the electrical device, and crosslinking the polymeric strands on the substrate portion to form a crosslinked polymer. In a still further alternative method, a method of fabricating an electrical device comprises the steps of: Providing a plurality of polymeric strands and a plurality of macrocycles; depositing at least some of the polymeric strands and some of the macrocycles onto a substrate portion of the electrical device, and crosslinking the at least some of the polymeric strands on the substrate portion by forming a covalent bond between the at least some of the polymeric strands and the least some of the macrocycle.

Macrocycles can be provided by a large variety of known methods. For example, U.S. Pat. No. 5,384,391 to Miyata et al. (January 1995) describes synthesis of cyclic arylene sulfide oligomers. In another example, U.S. Pat. No. 5,869,599 to Hay et al. (February 1999) describes synthesis of macrocyclic poly(aryl ether) and poly(aryl ether sulfide). In yet another example, U.S. Pat. No. 5,264,538 to Mullins et al. (November 1993) teaches the synthesis of cyclic poly(aryl ether) oligomers. These, as well as all other viable methods of preparing macromacrocycles are contemplated for use herein.

Reactions of substrates to form macrocycles are generally achieved by presenting reactants to each other at relatively low concentrations, at which intramolecular reactions are entropically favored. In preferred embodiments of the present application, the macrocycles comprise an arylene ether or poly(arylene ether), and cyclization of the preferred arylene ether or poly(arylene ethers) is achieved by employing conformationally matchable building blocks, which advantageously allows higher concentrations of reactants and concomitantly higher yields of the cyclic reaction products. The term "conformationally matchable" building blocks refers to compounds in which bond angles and distance of reactive groups in one reactant are closely matched with the bond angles and distance of reactive groups in the other reactant. It should especially be appreciated that the bisphenolic compounds and difluoroaromatic compounds presented herein are considered conformationally matchable building blocks.

Figure 2A:
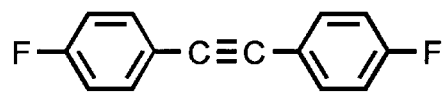
FIGS. 2A–2I are exemplary difluoroaromatic compounds for the fabrication of macrocycles according to the inventive subject matter.
Figure 2B:
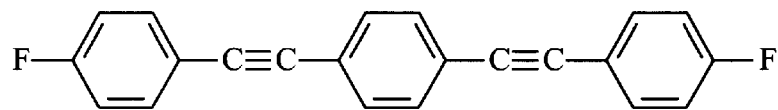
Figure 2C:
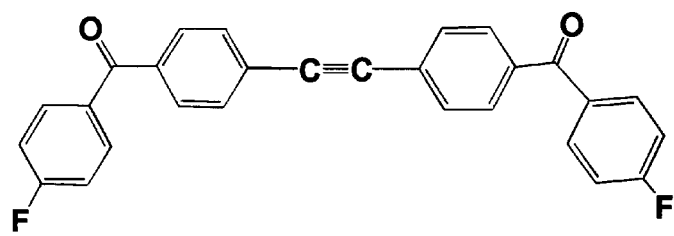
Figure 2D:
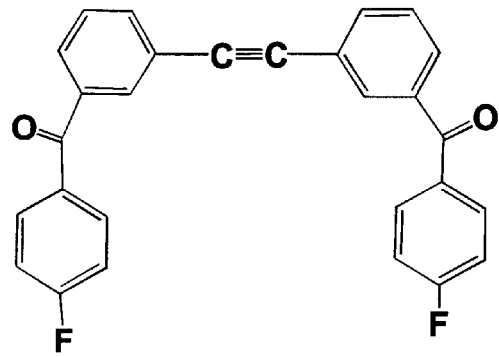
Figure 2E:
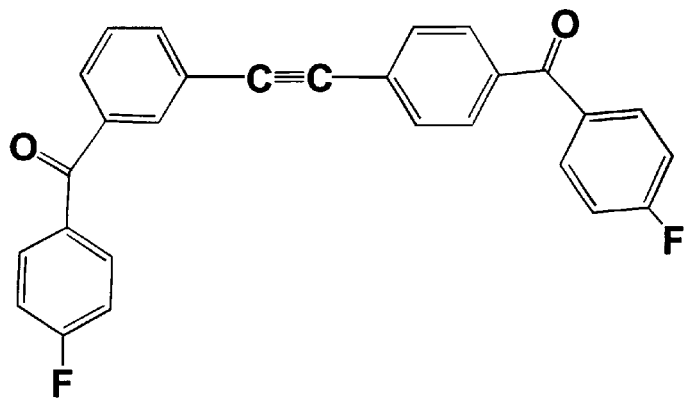
Figure 2F:
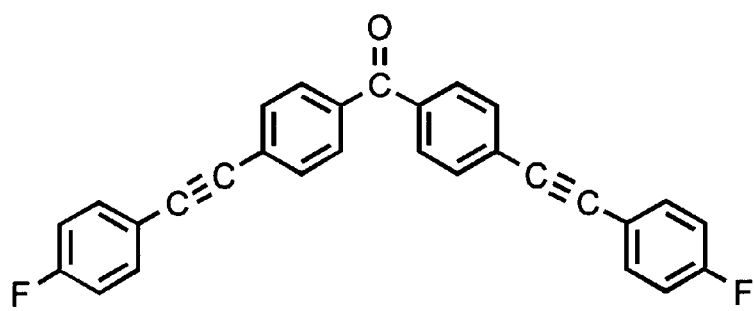
Figure 2G:
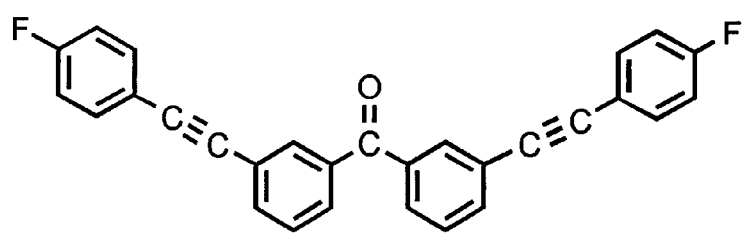
Figure 2H:
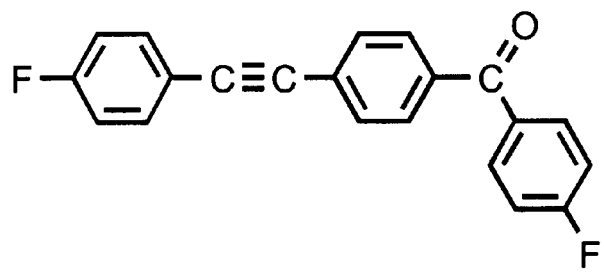
Figure 2I:
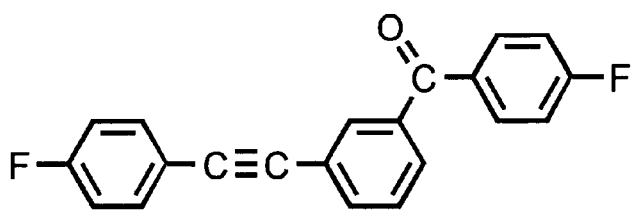
Figure 3:
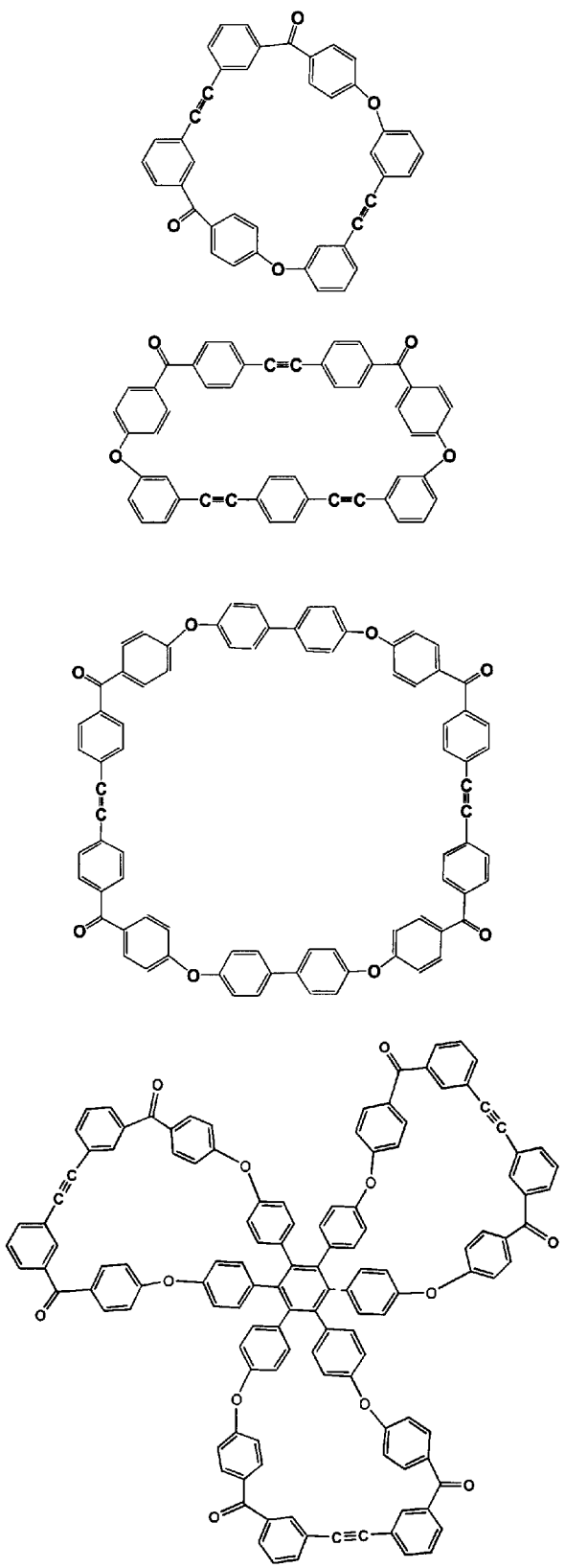
FIG. 3 shows various macrocycles that can be used in crosslinking or polymerization to form polymeric strands according to the inventive subject matter.

A preferred generic synthetic method for preparing poly(arylene ether) macrocycles and poly(arylene ether) polymeric strands that may comprise macrocycles is shown in FIG. 1 and follows a standard nucleophilic aromatic substitution reaction as discussed in "Engieneering Plastics A Handbook of Polyarylethers" by R. J. Cotter (published 1994, Gordon and Breach Science Publishers S.A., Basel Switzerland). Here, an exemplary aromatic dihydroxy-compound (e.g., a bisphenol) 1 is combined with an exemplary difluoroaromatic compound 2 under suitable reaction conditions ($K_2CO_3$, NMP, Stage 1: 100–110° C. for 2 hr, Stage 2: 120° C. for 6 hr, both reactants at high dilution) to produce an exemplary poly(arylene ether) 3. It should be appreciated, however, that in other contemplated schemes a large variety of alternative aromatic dihydroxy-compounds may be employed. For example, it is contemplated that many bisphenols and various difluoroaromatic compounds may be appropriate, and especially contemplated bisphenolic compounds include substituted and unsubstituted fluorene bisphenol and substituted and unsubstituted sexiphenylenediol. Examples for especially contemplated difluoroaromatic compounds are shown in FIGS. 2A–2I. FIG. 2A depicts bis(4-fluorophenyl)ethyne (BFPE), FIG. 2B depicts 1,4-Bis(4-fluorophenylethynyl)benzene (BFPEB), and FIG. 2C depicts 4,4'-bis(4-fluorobenzoyl)tolane (4,4'-BFBZT). In FIG. 2D, 3,3'-bis(4-fluorobenzoyl)tolane(3,3'-BFBZT) is shown, and in FIG. 2E 3,4'-bis(4-fluorobenzoyl)tolane (3,4'-BFBZT) is depicted. FIG. 2F shows 4,4'-bis(4-fluorophenylethynyl)benzophenone (4,4'-FPEBP), FIG. 2G shows 3,3'-bis(4-fluorophenylethynyl)benzophenone (3,3'-FPEBP), and FIG. 2H depicts 4-Fluoro-4'-(4-fluorobenzoyl)tolane (4-FBZT). FIG. 2I shows 4-Fluoro-3'-(4-fluorobenzoyl)tolane (3-FBZT). By employing preferred bisphenols and difluoroaromatic compound, macrocycles may therefore comprise an arylene ether with at least six or at least 12 phenyls.

The building blocks (e.g., the difluoroaromatic compound and the bisphenolic compound) employed in fabricating the macrocycles are preferably ring containing structures, and most preferably phenyl containing structures. However, the building blocks contemplated herein refer to any chemical compound that is capable of forming a macrocycle. The repetitive bond formation between building blocks may lead to linear, branched, super-branched or three-dimensional products. Furthermore, building blocks may themselves comprise repeating units, and when polymerized the polymers formed from such building blocks are then termed "blockpolymers". Building blocks may also belong to various chemical classes of molecules including organic, organometallic or inorganic molecules. Examples of organic building blocks are acrylamide, vinylchloride, fluorene bisphenol or 3,3'-dihydroxytolane. Examples of organometallic building blocks are octamethylcyclotetrasiloxane, methylphenylcyclotetrasiloxane, etc. Examples of inorganic building blocks include $SiO_2$ or $Al_2O_3$. The molecular weight of building blocks may vary greatly between about 40 Dalton and 20000 Dalton. However, especially when building blocks comprise repeating units, building blocks may have even higher molecular weights. Building blocks may also include thermolabile groups or functionalities for crosslinking. For example, building blocks may comprise poly(propylene oxide), polycarbonates, poly(methylmethacrylate), various styrenic polymers, or ethynyl- or tetracyclone groups.

Figure 4:
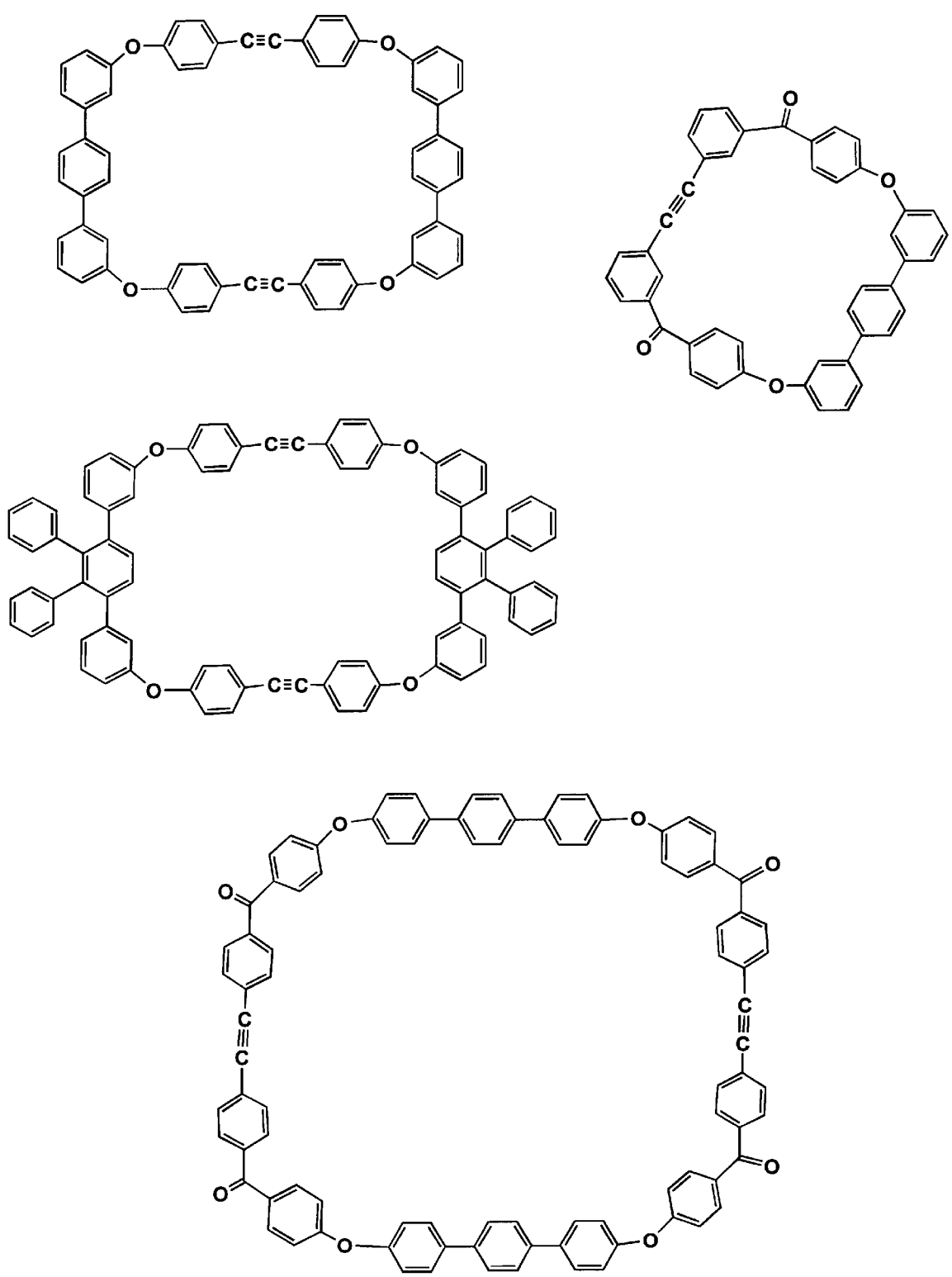
FIG. 4 shows various macrocycles according to the inventive subject matter.
Figure 5A:
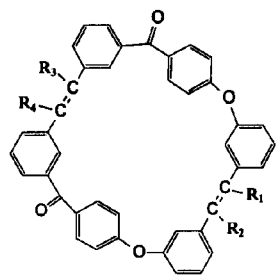
FIGS. 5A–5D show exemplary macrocycles incorporated into polymeric strands.
Figure 5B:
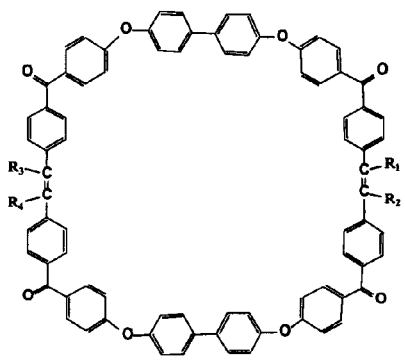
Figure 5C:
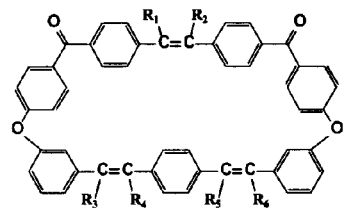
Figure 5D:
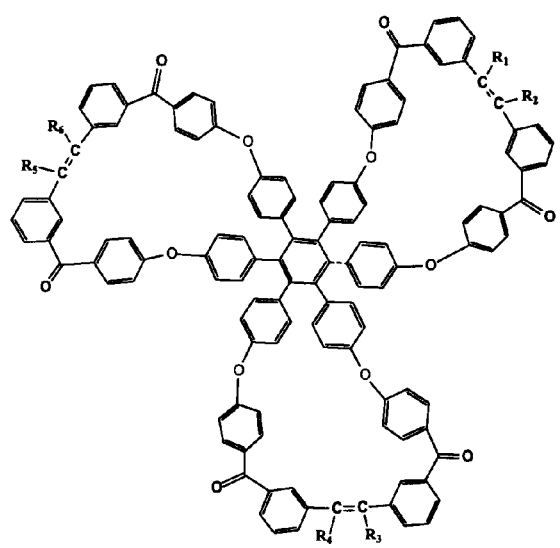
Figure 6A:
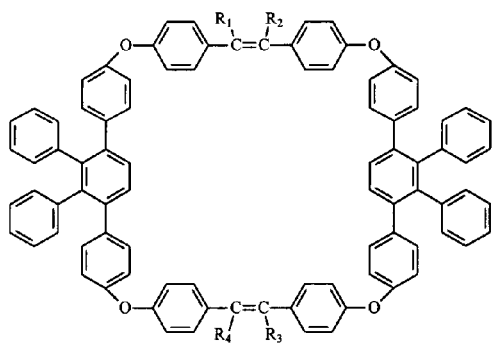
FIGS. 6A–6D show exemplary macrocycles incorporated into polymeric strands.
Figure 6B:
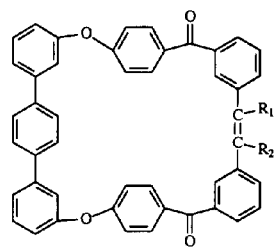
Figure 6C:
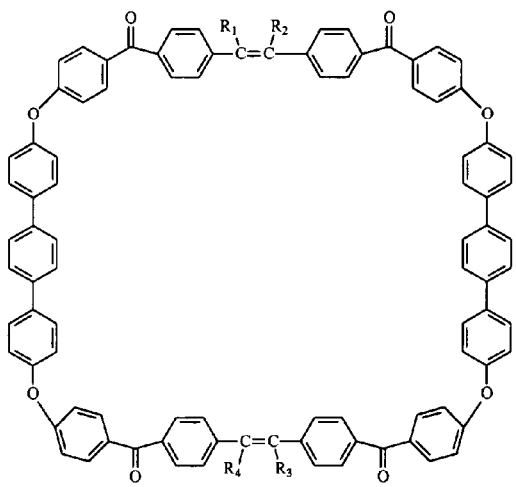
Figure 6D:
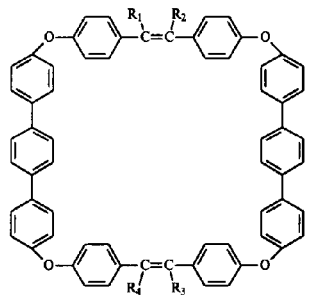

Thus, macrocycles may be branched, super-branched, or three-dimensional, and depending on the chemical nature of the building blocks macrocycles may belong to any chemical class, including organic, organometallic or inorganic compositions. Examples of organic macrocycles are polyimides, polyesters, or polybenzils. Examples of organometallic macrocycles are various substituted polysiloxanes, and examples of inorganic macrocycles include silica or alumina. The molecular weight of contemplated macrocycles may span a wide range, typically between 400 Dalton and 400000 Dalton or more. FIGS. 3 and 4 shows various macrocycles according to the inventive subject matter.

Macrocycles may also comprise a wide range of functional or structural moieties, including crosslinking groups, aromatic systems, and halogenated groups. Macrocycles may further have additional reactive groups capable of participating in a chemical reaction. Such reactive groups include, but are not limited to R—OH, R-Halogen, R—CO—R', R—$CO_2$—R', R—O—R', R—$NH_2$, R—SH, R—$NO_2$,R—CH=CH—R, R—C≡C—R. Especially preferred macrocycles are those having crosslinking groups comprising a diene and a dienophile, and a particularly preferred class comprises macrocycles in which the diene is a cyclopentadieneone and the dienophile has a triple bond.

Other preferred embodiments may be characterized by a modification of the aromatic portion of the building blocks (e.g., modification of the aromatic bisphenolic compound or aromatic portion of the difluoroaromatic compound). Such modifications may include isomeric variations, or addition or removal of aromatic groups. For example, a tetracyclone, halogens, amides, alcohols, aliphatic or aromatic substituents may be introduced into an aromatic portion of a bisphenolic compound. Analogous changes are also contemplated for the aromatic portion of a difluoroaromatic compound. In yet another class of variations, a $sp^2$-hybridized carbon atom may be replaced by any other appropriate atom, including sulfur, oxygen, nitrogen, etc.

Macrocycles may be polymerized to form a plurality of polymeric strands by various methods, including polymerization with or without additionally added molecules. It is preferred, however, that polymerization takes place without additionally added molecules by utilizing reactive groups that are positioned within the macrocycle. Especially contemplated reactive groups include pending groups and groups integrated into the building blocks of a macrocycle. While many types of reactive groups, including nucleophilic, electrophilic, and activated groups are generally contemplated, especially reactive groups include dienes and dienophile groups, and groups that can undergo cycloaddition without addition of an extrinsic crosslinker. In particularly preferred aspects of the inventive subject matter, the reactive groups comprise a triple bond (e.g., ethynyl groups) and diene groups. FIG. 3 shows various examples of macrocycles that can be polymerized. Where the crosslinking groups are ethynyl groups and tetracyclone groups to polymerize the macrocycles in a cyclo-addition reaction, polymerization is preferably performed by heating the macrocycles, typically to about 150° C. to 300° C. for at least 15–60 minutes. In alternative aspects of the inventive subject matter, various polymerizations other than a cyclo-addition reaction are also contemplated, including radical polymerization, addition polymerization, substitution polymerization, etc.

Consequently, depending on the chemical nature and position of crosslinking groups in the macrocycles, the polymeric strands formed by polymerization of the macrocycles may be linear, branched, super branched and three dimensional. The term "polymeric strand" as used herein refers to any configuration of monomers (e.g., macrocycles) that form a covalent bond with itself or a chemically different compound in a repetitive manner. Thus, a polymeric strand may have a configuration where all of the monomers are macrocycles, and in particularly contemplated polymeric strands, the macrocycles form a backbone in the polymeric strand. As used herein, the term "backbone" refers to a contiguous chain of covalently bound atoms or moieties, in which removal of any of the atoms or moiety would result in interruption of the chain. It should be appreciated, however, that in alternative polymeric strands macrocycles may be pending groups or terminal groups in a polymeric strand, or may be included in the backbone of a polymeric strand. For example, a polyimide polymeric strand may have macrocycles at its termini, while a polycarbonate strand may have macrocycles within its backbone. With respect to the amount of macrocycles in a polymeric strand, it is contemplated that the amount may vary considerably depending on the desired degree of nanoporosity. For example, while in applications that require a high degree of porosity (e.g., to achieve a relatively low dielectric constant) all or almost all of the monomers may be macrocycles, other applications may have between about 85% to 15% or less macrocycles in the polymeric strand. Contemplated polymeric strands may further include pendant groups, such as reactive groups, structural groups, crosslinking groups, etc.

With respect to incorporating macrocycles into a polymeric strand (e.g., into the backbone, the termini or as pendant groups) it is contemplated that many methods already known in the industry, which can readily be adapted for use herein. For example, integration of macrocycles into the backbone of the polymeric may be achieved by copolymerization of macrocycles and non-macrocycle monomers wherein reactive groups of the macrocycles react with reactive groups of the non-macrocycles. Alternatively, macrocycles may be added as terminal or pendent groups to a polymeric strand by reacting reactive groups of a macrocycle with reactive groups that are located on a terminus or side chain of a polymeric strand. Thus, where polymeric strands having at least one macrocycle are provided, such polymeric strands can be prepared by methods known in the art and are not restricted to a particular chemical composition or structure. It is contemplated, however, that particularly preferred polymeric strands include poly(arylene ether) strands with macrocycles located within their backbone, on the termini, or as a pendant group. It is further contemplated that integration of preferred macrocycles (e.g., cyclic poly(arylene ether)) into a polymeric strand may be achieved by a cycloaddition between at least two reactive groups, preferably including a diene and a dienophile, or two ethynyl groups. FIGS. 5A–5D and 6A–6D show exemplary macrocycles incorporated into polymeric strands (strands not shown), wherein $R_1$, $R_2$, $R_3$, $R_4$, $R_5$, and $R_6$ are independently a carbon atom of a polymer or a macrocycle. Where $R_1$–$R_6$ is a carbon atom of a macrocycle, it is especially contemplated that the carbon atom is bound in a triple bond (e.g., $R_1$ is bound to $R_2$ with a triple bond where the macrocycle is on a terminus of a polymeric strand).

In still further alternative aspects of the inventive subject matter, a polymeric strand need not necessarily have macrocycles as part of the backbone, at the terminus or on a side chain. Thus, where polymeric strands having no macrocycle are provided, such polymeric strands can be prepared by methods known in the art and are not restricted to a particular chemical composition or structure. It is contemplated, however, that particularly preferred polymeric strands and macrocycles include a poly(arylene ether).

With respect to the step of depositing macrocycles and/or polymeric strands with or without macrocycles onto a substrate portion of an electrical device, many of the methods already known in the industry are applicable, such as those described in U.S. Pat. No. 5,874,516 to Burgoyne et al. (February 1999), incorporated herein by reference. For example, films or coatings of the polymers described herein can be deposited by solution techniques such as spraying, spin coating or casting, with spin coating being preferred. Preferred solvents are 2-ethoxyethyl ether, cyclohexanone, cyclopentanone, toluene, xylene, chlorobenzene, N-methyl pyrrolidinone, N,N-dimethylformamide, N,N-dimethylacetamide, methyl isobutyl ketone, 2-methoxyethyl ether, 5-methyl-2-hexanone, γ-butyrolactone, and mixtures thereof. Typically, the coating thickness is between about 0.1 to about 15 microns. As a dielectric interlayer, the film thickness is preferably less than 2 microns.

It is also contemplated that additives can be used to enhance or impart particular target properties, as is conventionally known in the polymer art, including stabilizers, flame retardants, pigments, plasticizers, surfactants, and the like. Compatible or non-compatible polymers can be blended in to give a desired property. Adhesion promoters can also be used to adhere the polymer to the appropriate substrate(s). Such promoters are typified by hexamethyldisilazane, which can be used to interact with available hydroxyl functionality that may be present on a surface, such as silicon dioxide, that was exposed to moisture or humidity.

With respect to the step of crosslinking the polymeric strands to form a crosslinked polymer, it is contemplated that many methods already known in the industry can be adapted for use herein. Crosslinking is typically mediated by various crosslinking groups and may occur by numerous mechanisms. If a covalent bond is formed between two reactive groups, it may be formed by a variety of chemical reaction mechanisms, including additions, eliminations or substitutions. Examples are nucleophilic or electrophilic addition, E1- or E2-type eliminations, nucleophilic and aromatic substitutions. Crosslinking may also be a spontaneous process or may require energy or a catalyst. Examples of such energy are thermal energy, radiation, mechanic, electric or electromagnetic energy. Examples of catalysts are acids, bases, and palladium-coated activated charcoal. In yet further alternative embodiments, crosslinking may or may not involve extrinsic crosslinkers. Extrinsic crosslinkers may comprise single molecules, but also oligomeric or even polymeric molecules.

It is especially contemplated that crosslinking may be performed by forming a covalent bond between polymeric strands and a macrocycle. For example, a crosslinking macrocycle may comprise two triple bonds (e.g., ethynyl groups) as crosslinking groups and two backbones of two polymeric strands may comprise a tetracyclone group as a reactive group, respectively. In a cyclo-addition reaction, the ethynyl groups from the macrocycle react with the two tetracyclone groups from the two backbones to form a crosslinked polymer. In this sense, a macrocycle acts as an extrinsic crosslinker. Moreover, macrocycles used as extrinsic crosslinkers need not be macrocycles, but may also include a plurality of macrocycles or a mixture of different macrocycle.

It is further contemplated that the number of crosslinking groups in a strand that are used for crosslinking may vary widely. This would typically depend on the strength of crosslinking required, as well the strength of the individual crosslinking links. For example, to form a stable crosslink at room temperature between two single strands of nucleic acids, a minimum of about 20–25 hydrogen bonds is required. In contrast, only one covalent bond is needed to achieve a crosslink with even higher stability. It is also contemplated that the number of crosslinking groups participating in crosslinking may vary within a wide range. For example, crosslinking may involve as little as 5% of crosslinking groups, but may also involve more than 90% of all available crosslinking groups in the polymeric strands.

The term "crosslinking group" as used herein refers to chemical group or moiety having sufficient reactivity to form an at least temporary connection (e.g., covalent bond, hydrogen bond, ionic bond) with another chemical group or moiety. It is contemplated that crosslinking groups in general can be positioned in any part of a backbone, including the termini. In preferred embodiments, crosslinking groups include a diene and a dienophile, and in even more preferred embodiments the diene may comprise a tetracyclone and the dienophile may comprise an ethynyl group.

It is especially contemplated that the polymers described herein may be advantageously employed as an insulating layer on numerous devices. For example, the polymers may be employed in insulating various portions of the traces printed directly on a substrate, or in insulating various discrete conductors in a common layer. The polymers may be also used in multichip modules to provide insulation between various layers of a multilayer interconnect. In such cases, one of the substrates would typically comprise silicon, glass or ceramic. Still further, the polymers described herein can be used as interlayer dielectrics in an interconnect associated with a single integrated circuit chip. Other contemplated uses include protective coatings on integrated circuit chips, such as for protection against alpha particles. Still another contemplated use is in the main body of circuit boards or printed wiring boards. Such boards may also include various reinforcements such as glass cloth or other woven nonconducting fibers. Contemplated circuit boards may be single sided, as well as double sided or have a multiplayer configuration. Thus, an electrical device can be fabricated that has a dielectric layer, which is fabricated in a process employing a compound having a structure as shown in FIGS. 3 and 4, and it is especially contemplated that the dielectric layers have a dielectric constant of less than 3.0, and preferably less than 2.5.

Since the polymers described herein comprise macrocycles, they will usually contain numerous voids, especially voids on the nanometer scale. The porosity can be increased further by including thermolabile groups in at least some of the macrocycles, and then thermolyzing the thermolabile groups to form additional voids. Thermolabile groups can be included anywhere, but are especially contemplated to be included as pendant to the backbone of the macrocycles. Preferred thermolabile groups degrade above an elevated temperature, typically in the range of 250° C. to 450° C. Exemplary thermolabile groups are polypropyleneoxide, polylactides, polycarbonates or polymethylmethacrylate. An especially preferred thermolabile group is ethylene glycol-poly(caprolactone). Thermolabile groups may advantageously be coupled to a backbone using a connector moiety at any suitable position. The size of the connector moiety may vary considerably from molecular weights of about 20 Dalton to about and above 500 Dalton. Examples of relatively small connector moieties are acidic groups, basic groups, nucleophilic groups and electrophilic groups. Alternative small connector moieties are, for example, R—CO$_2$H, R—CO—R', R—NH$_2$, R—SH, R-Halogen and so on. Examples of larger connector moieties are tetracyclones, cyclopentadiene groups or bifunctional aliphatic groups, including especially 1,2-diaminobenzenes or 1,3-diphenylpropan-2-ones. It is further contemplated that alternative connector moieties need not engage in formation of a covalent bond. Appropriate alternative connectors may engage in non-covalent coupling including hydrophobic-, electrostatic-ionic interactions, complex formation or hydrogen bonding. Examples are leucine zipper-like structures, highly polar groups, polycationic groups or polyanionic groups, and polydentate-type groups.

EXAMPLES

Examples 1–9 depict exemplary macrocycles that can be utilized in accordance with the teachings herein, and an exemplary synthetic procedure for cyclic oligomers is described below. Cyclic oligomers were synthesized from various monomers used in poly(arylene ether) synthesis, including fluorene bisphenol (FBP), and the difluoroaromatic monomers, 4,4'-difluorobenzophenone (DFBP), bis(4-fuorophenyl)ethyne (BFPE), 4-fluoro-3'-(4-fluorobenzoyl)tolane (FBZT) and 3,3'-bis(4-fluorobenzoyl)tolane (BFBZT). The cyclic oligomer preparations were conducted in pseudo high dilution conditions (monomers were loaded in 4 portions, at a concentration of solids of ≦0.2%, to achieve a final solution of ≦1%) in DMF at 150° C. or sulfolane at 180° C. Toluene was commonly used for the azeotropic removal of water. The reaction was promoted by potassium carbonate. The extremely low concentration was designed to favor the intramolecular formation of cyclic oligomers. The course of the reaction was monitored by GPC.

Example 1

Macrocycle 4 was prepared by reacting equimolar amounts of fluorene-9,9-bisphenol with 4,4'-bis(4-fluorobenzoyl)tolane

4

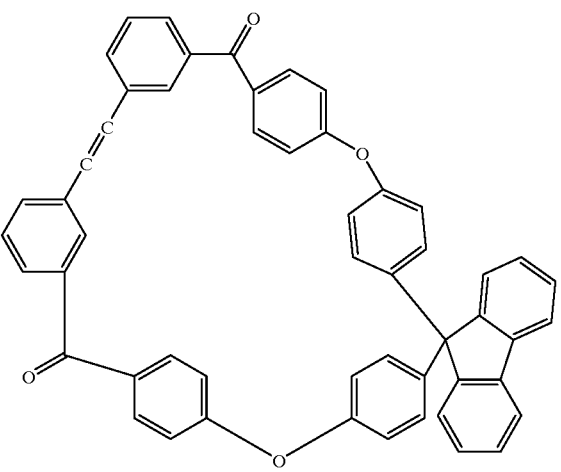

Fluorene bisphenol (0.7008 g, 0.002 Mol, from Nippon Steel, dried overnight), 3,3'-bis(4-fluorobenzoyl)tolane (BFBZT, 0.8449 g, 0.002 Mol), and potassium carbonate (25.014 g, 0.181 Mol) were mixed in 500 mL of N,N-dimethylformamide (DMF) containing 40 mL of toluene. The deaerated mixture was heated under nitrogen for 24 h. GPC indicated that a fast reaction occurred within an hour and subsequent heating afforded no further change. By thin-layer chromatography, it was established that no starting monomers remained after one hour. The crude product was subjected to flash column chromatography (20% ethyl acetate in hexanes). The pure main product was isolated and analyzed by elemental, MS, and NMR analysis. Comparing the NMR spectra of this product with those of fluorene bisphenol (FBP), 3,3'-bis(4-fluorobenzoyl)tolane (BFBZT or BFBPA), linear oligomer, and cyclic oligomer with n=2, indicated identity of the predominant reaction product with cyclic structure 4. Contrary to BFBZT, F was not detected with 19F NMR. Solid probe EI/MS-spectra showed strong parent peak with mass 732.1.

It is contemplated that the reason for the high yield of the n=1 cyclic oligomer 4 is the thermodynamic advantage of cyclic versus linear structures (cyclics do not have end groups) and the highest probability of cyclic oligomer with n=1 formation (when it is sterically possible). Furthermore, the first reaction intermediate (linear oligomer, n=1) can have a conformation near to cyclic because of specific BFBZT structure (two C=O groups and two meta-phenylene groups with an angle of 120°). The macrocycle formation is energetically favorable that in that it competes successfully with linear oligomer formation, thereby resulting in a nearly 70% yield of cyclic oligomers with n=1 as estimated from GPC curve.

Example 2

Macrocycle 5 was prepared by reacting equimolar amounts of spiro-9,9-fluorene-spiro-10,10-xanthenediol with 4,4'-bis(4-fluorobenzoyl)tolane under reaction conditions as generally outlined in Example 1.

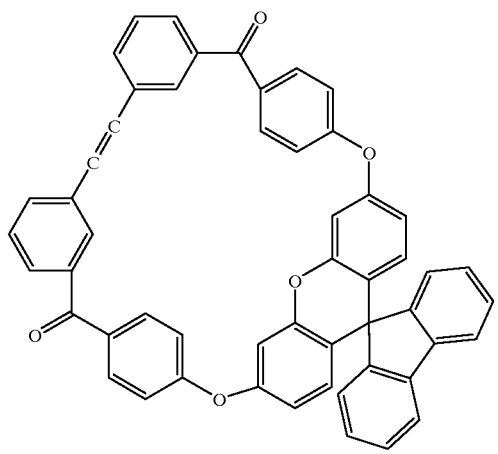

Example 3

Macrocycle 5 was prepared by reacting equimolar amounts of 3,3'-dihydroxytolane with 4,4'-bis(4-fluorobenzoyl)tolane under reaction conditions as generally outlined in Example 1.

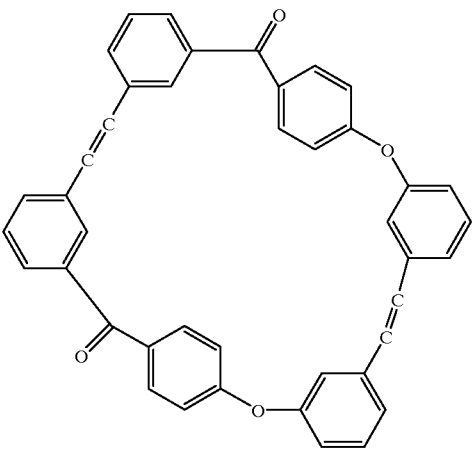

Example 4

Macrocycle 6 was prepared by reacting equimolar amounts of 4,4'-dihydroxybiphenyl with 4,4'-bis(4-fluorobenzoyl)tolane under reaction conditions as generally outlined in Example 1.

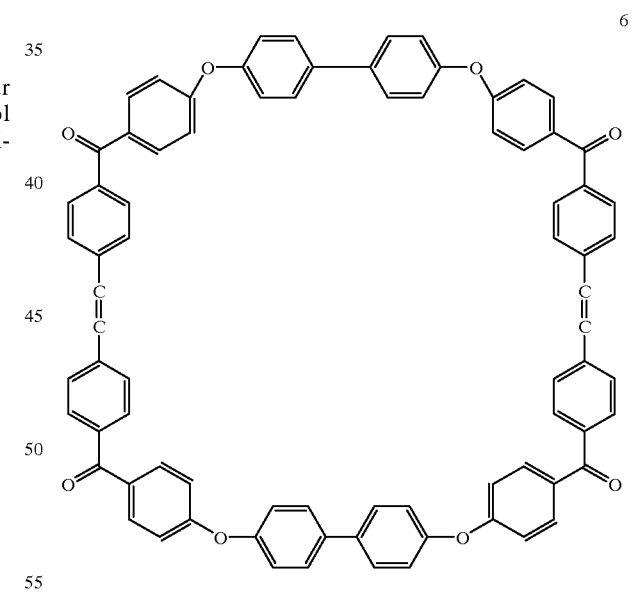

Example 5

Macrocycle 7 and 8 were prepared by reacting tetraphenolmethane or tetraphenolsilane with a twofold molar excess of 3,3'-bis(4-fluorobenzoyl)tolane, respectively, under reaction conditions as generally outlined in Example 1.

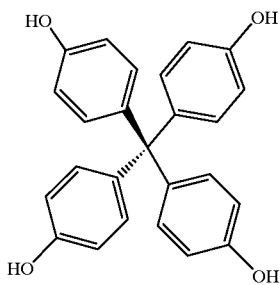
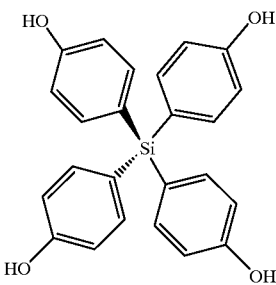
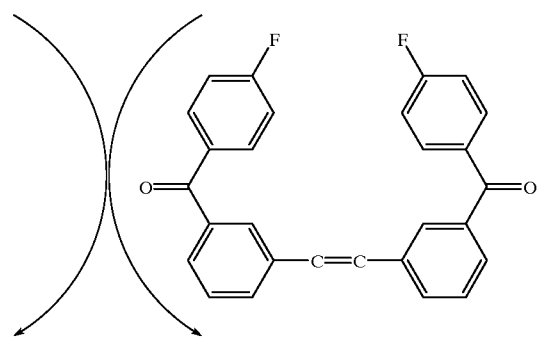
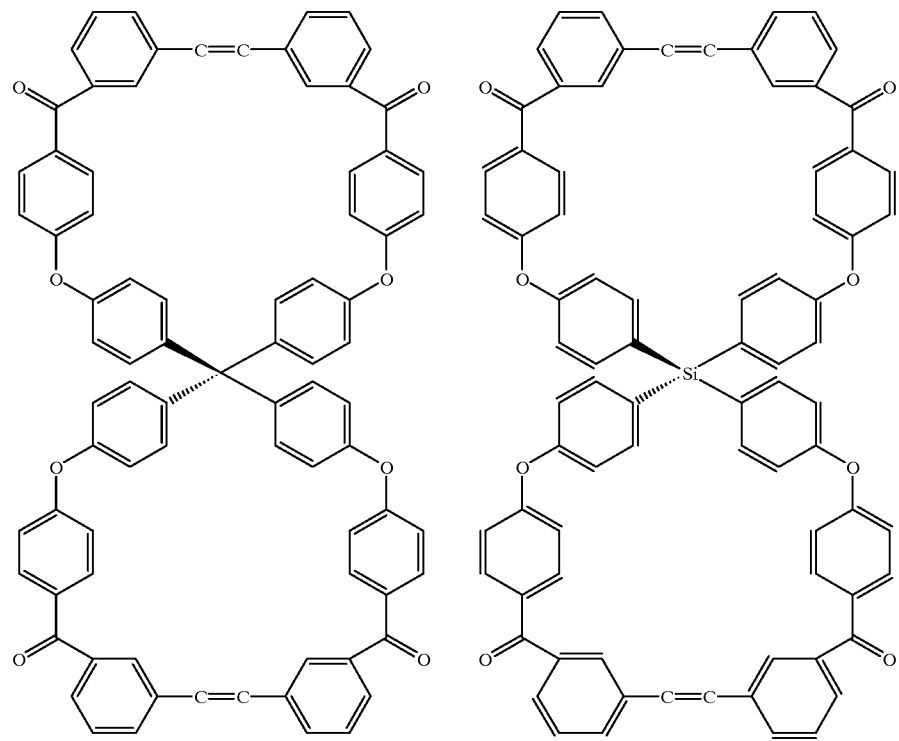

Example 6

Macrocycle 9 was prepared by reacting hexaphenolbenzene with a threefold molar excess of 4,4'-bis(4-fluorobenzoyl)tolane under reaction conditions as generally outlined in Example 1.

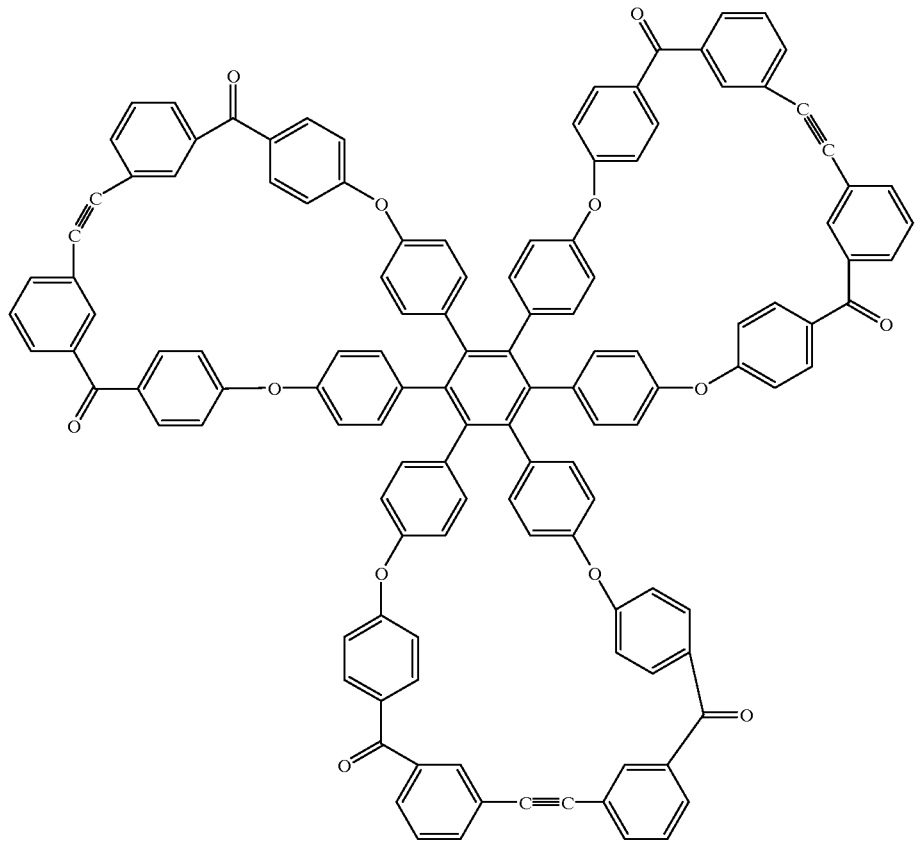

Thus, specific embodiments and applications have been disclosed regarding fabrication of electrical devices using polymers of macrocycles. It should be apparent, however, to those skilled in the art that many more modifications besides those already described are possible without departing from the inventive concepts herein. The inventive subject matter, therefore, is not to be restricted except in the spirit of the appended claims.

What is claimed is:

1. An electrical device comprising a dielectric layer that includes a compound having a structure selected from the group consisting of

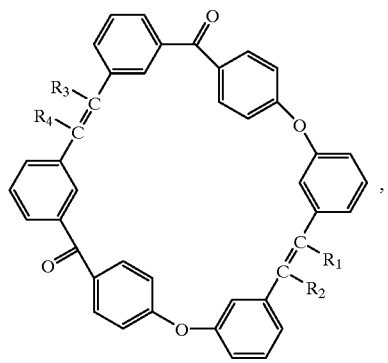

-continued

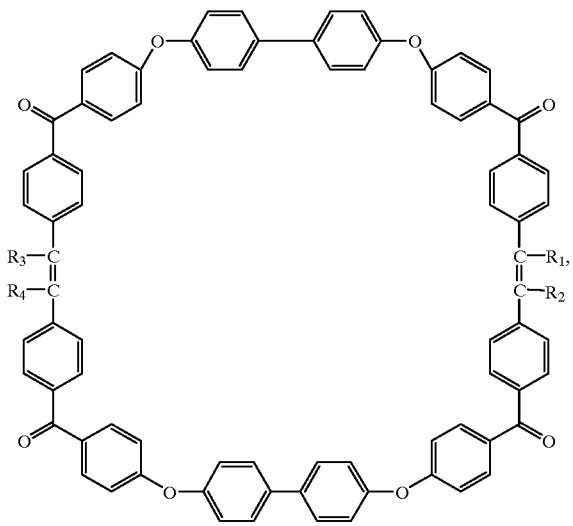

-continued

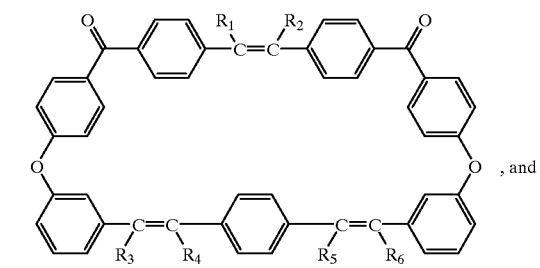
, and

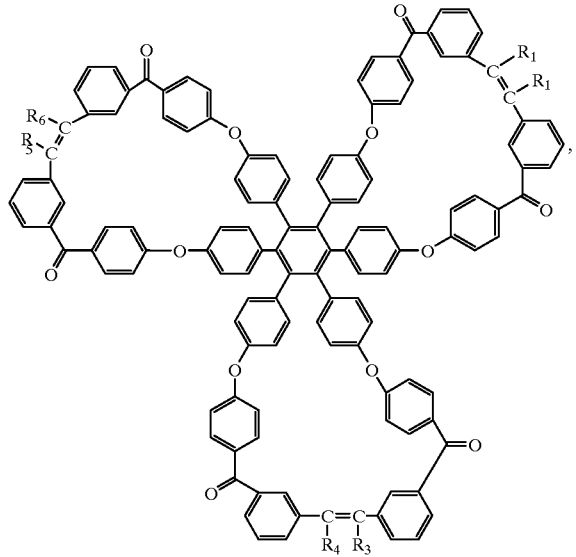

wherein $R_1$, $R_2$, $R_3$, $R_4$, $R_5$, and $R_6$ is independently a carbon atom of a structure selected from the group consisting of a polymer and a macrocycle.

2. The electrical device of claim 1 wherein the dielectric layer has a dielectric constant of less than 3.0.

3. The electrical device of claim 1 wherein the dielectric layer has a dielectric constant of less than 2.5.

4. An electrical device including a dielectric layer that is fabricated in a process employing a compound having a structure selected from the group consisting of

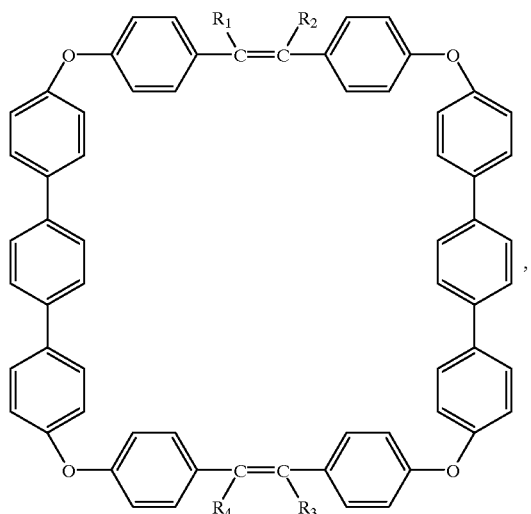

-continued

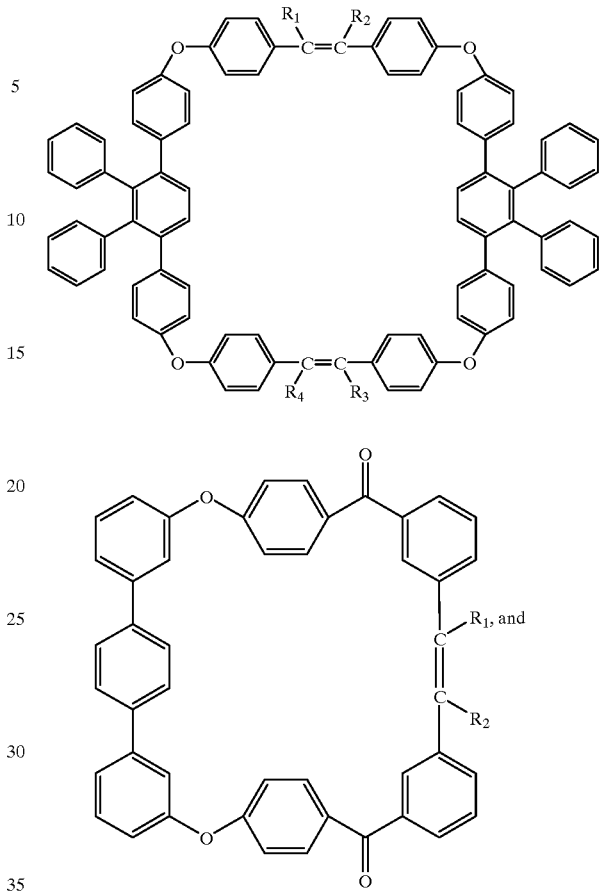

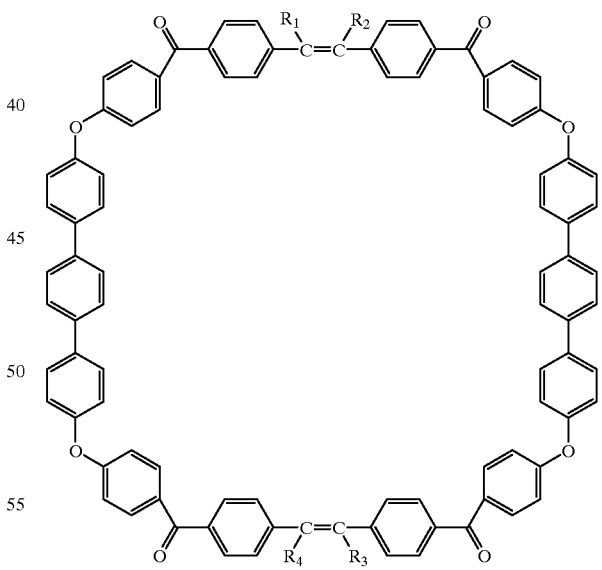

wherein $R_1$, $R_2$, $R_3$, $R_4$, $R_5$, and $R_6$ is independently a carbon atom of a structure selected from the group consisting of a polymer and a macrocycle.

5. The electrical device of claim 2 wherein the dielectric layer has a dielectric constant of less than 3.0.

6. The electrical device of claim 2 wherein the dielectric layer has a dielectric constant of less than 2.5.

7. A method of fabricating an electrical device comprising:
- providing a plurality of macrocycles;
- depositing at least some of the macrocycles onto a substrate portion of the electrical device;
- polymerizing the at least some of the macrocycles on the substrate portion to form a plurality of polymeric strands; and
- crosslinking at least some of the polymeric strands on the substrate portion to form a crosslinked polymer.

8. The method of claim 7 wherein at least one of the macrocycles comprises an arylene ether.

9. The method of claim 7 wherein at least one of the macrocycles comprises an arylene ether having at least six phenyls.

10. The method of claim 7 wherein at least one of the macrocycles comprises an arylene ether having at least twelve phenyls.

11. The method of claim 7 wherein two of the macrocycles are coupled to a single atom selected from the group consisting of a carbon atom and a silicon atom.

12. The method of claim 7 wherein at least three of the macrocycles are coupled to a single phenyl group.

13. The method of claim 7 wherein at least one of the macrocycles has a completely conjugated backbone.

14. The method of claim 7 wherein at least one of the macrocycles comprises a triple bond.

15. The method of claim 7 wherein at least some of the crosslinking occurs without addition of an extrinsic crosslinker.

16. The method of claim 7 wherein at least one of the macrocycles comprises a triple bond, and at least some of the crosslinking occurs at the triple bond.

17. The method of claim 7 wherein at least one of the macrocycles comprises a triple bond, and at least some of the polymerizing occurs at the triple bond.

18. The method of claim 7 further comprising fabricating at least some of the macrocycles from a bisphenol and a difluoroaromatic compound.

19. The method of claim 18 wherein the bisphenol is selected from the group consisting of a fluorene bisphenol and a sexiphenylenediol.

20. The method of claim 18 wherein the difluoroaromatic compound is selected from the group consisting of bis(4-fluorophenyl)ethyne (BFPE), 1,4-bis-(4-fluorophenylethynyl)benzene (BFPEB), 4,4'-bis(4-fluorobenzoyl)tolane (4,4'-BFBZT), 3,3'-bis(4-fluorobenzoyl)tolane (3,3'-BFBZT), 3,4'-bis(4-fluorobenzoyl)tolane (3,4'-BFBZT), 4,4'-bis(4fluorophenylethynyl)benzophenone (4,4'-FPEBP), 3,3'-bis(4-fluorophenylethynyl)benzo-phenone (3,3'-FPEBP), 4-fluoro-4'-(4-fluorobenzoyl)tolane (4-FBZT), and 4-fluoro-3'-(4-fluorobenzo-yl)tolane (3-FBZT).

21. A method of fabricating an electrical device comprising:
- providing a plurality of polymeric strands having at least one macrocycle;
- depositing at least some of the polymeric strands onto a substrate portion of the electrical device; and
- crosslinking the polymeric strands on the substrate portion to form a crosslinked polymer.

22. The method of claim 21 wherein the plurality of polymeric strands comprises a poly(arylene ether).

23. The method of claim 21 wherein the at least one macrocycle has at least six phenyls.

24. The method of claim 21 wherein the at least one macrocycle is covalently bound to the plurality of polymeric strands on a position selected from the group consisting of a terminus of the polymeric strand, a backbone of the polymeric strand, and a side chain of the polymeric strand.

25. The method of claim 21 wherein at least some of the crosslinking occurs without addition of an extrinsic crosslinker.

26. A method of fabricating an electrical device comprising:
- providing a plurality of polymeric strands and a plurality of macrocycles;
- depositing at least some of the polymeric strands and some of the macrocycles onto a substrate portion of the electrical device; and
- crosslinking the at least some of the polymeric strands on the substrate portion by forming a covalent bond between the at least some of the polymeric strands and the least some of the macrocycle.

27. The method of claim 26 wherein at least one of the polymeric strands comprises a poly(arylene ether).

28. The method of claim 26 wherein at least one of the macrocycles comprises a poly(arylene ether).

29. The method of claim 26 wherein at least some of the crosslinking occurs without addition of an extrinsic crosslinker.

30. The method of claim 26 wherein at least one of the macrocycles comprises a triple bond, and at least some of the crosslinking occurs at the triple bond.

\* \* \* \* \*